(12) United States Patent
Muchherla et al.

(10) Patent No.: US 11,200,957 B2
(45) Date of Patent: Dec. 14, 2021

(54) READ DISTURB SCAN CONSOLIDATION

(71) Applicant: Micron Technology, Inc., Boise, ID (US)

(72) Inventors: Kishore Kumar Muchherla, Fremont, CA (US); Vamsi Pavan Rayaprolu, San Jose, CA (US); Ashutosh Malshe, Fremont, CA (US); Harish R. Singidi, Fremont, CA (US); Gianni S. Alsasua, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/249,087

(22) Filed: Feb. 19, 2021

(65) Prior Publication Data

US 2021/0191815 A1  Jun. 24, 2021

Related U.S. Application Data

(63) Continuation-in-part of application No. 16/530,616, filed on Aug. 2, 2019, now Pat. No. 10,950,317.

(51) Int. Cl.
| | |
|---|---|
| *G11C 29/50* | (2006.01) |
| *G11C 16/34* | (2006.01) |
| *G11C 16/26* | (2006.01) |
| *G06F 11/07* | (2006.01) |
| *G06F 3/06* | (2006.01) |

(Continued)

(52) U.S. Cl.
CPC ......... *G11C 16/3418* (2013.01); *G06F 3/064* (2013.01); *G06F 3/0616* (2013.01); *G06F 3/0619* (2013.01); *G06F 3/0646* (2013.01); *G06F 3/0647* (2013.01); *G06F 3/0673* (2013.01); *G06F 3/0679* (2013.01); *G06F 11/076* (2013.01); *G06F 11/0793* (2013.01); *G06F 11/1068* (2013.01);

(Continued)

(58) Field of Classification Search
CPC ............................... G11C 29/50; G11C 16/34
USPC ........................................................ 365/201
See application file for complete search history.

(56) References Cited

U.S. PATENT DOCUMENTS

| | | |
|---|---|---|
| 2008/0055989 A1 | 3/2008 | Lee et al. |
| 2014/0164679 A1 | 6/2014 | Manohar et al. |

(Continued)

FOREIGN PATENT DOCUMENTS

| | | |
|---|---|---|
| WO | 2016069126 A1 | 5/2016 |

OTHER PUBLICATIONS

International Search Report and Written Opinion for International Application No. PCT/US2020/044643 dated Nov. 6, 2020, 11 pages.

*Primary Examiner* — Jason Lappas
(74) *Attorney, Agent, or Firm* — Lowenstein Sandler LLP

(57) ABSTRACT

A processing device in a memory system maintains a counter to track a number of read operations performed on at least one of a physical block or a plurality of physical blocks of a memory device, wherein the counter is associated with the physical block or the plurality of physical blocks depending on an age of data stored on the physical block. The processing device further determines whether a value of the counter satisfies a first threshold criterion pertaining to the number of read operations performed, and responsive to the value of the counter satisfying the first threshold criterion, performs a data integrity scan to determine a first error rate.

20 Claims, 10 Drawing Sheets

(51) Int. Cl.
*G06F 11/10* (2006.01)
*G06F 11/20* (2006.01)

(52) U.S. Cl.
CPC ............ *G06F 11/203* (2013.01); *G11C 16/26* (2013.01); *G11C 29/50* (2013.01)

(56) References Cited

U.S. PATENT DOCUMENTS

| | | | |
|---|---|---|---|
| 2015/0113206 A1* | 4/2015 | Fitzpatrick | G11C 16/3495 711/103 |
| 2016/0335144 A1 | 11/2016 | Cai et al. | |
| 2018/0374549 A1 | 12/2018 | Padilla et al. | |

* cited by examiner

| Super Block | LUN1 | | LUN2 | | LUN3 | | LUN4 | |
|---|---|---|---|---|---|---|---|---|
| | P0 | P1 | P0 | P1 | P0 | P1 | P0 | P1 |
| S1 | C1 | C2 | C3 | C4 | C5 | C6 | C7 | C8 |
| S2 | C9 ||||||||
| S3 | C10 ||||||||

| Section/ Block # | Read Count | Scan Threshold | SWL Victim Region | Scaling Factor |
|---|---|---|---|---|
| 1 | | | | |
| 2 | | | | |
| 3 | | | | |
| N | | | | |
| | 4 Bytes | 4 Bytes | 5 bits | 3 bits |

READ DISTURB SCAN CONSOLIDATION

This application is a continuation of U.S. patent application Ser. No. 16/530,616, filed Aug. 2, 2019, which is herein incorporated by reference in its entirety.

TECHNICAL FIELD

Embodiments of the disclosure relate generally to memory sub-systems, and more specifically, relate to managing a memory sub-system including memory components with different characteristics.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a block diagram illustrating read counters at physical block level and super block level granularities in accordance with some embodiments of the present disclosure.

DETAILED DESCRIPTION

Figure 1:
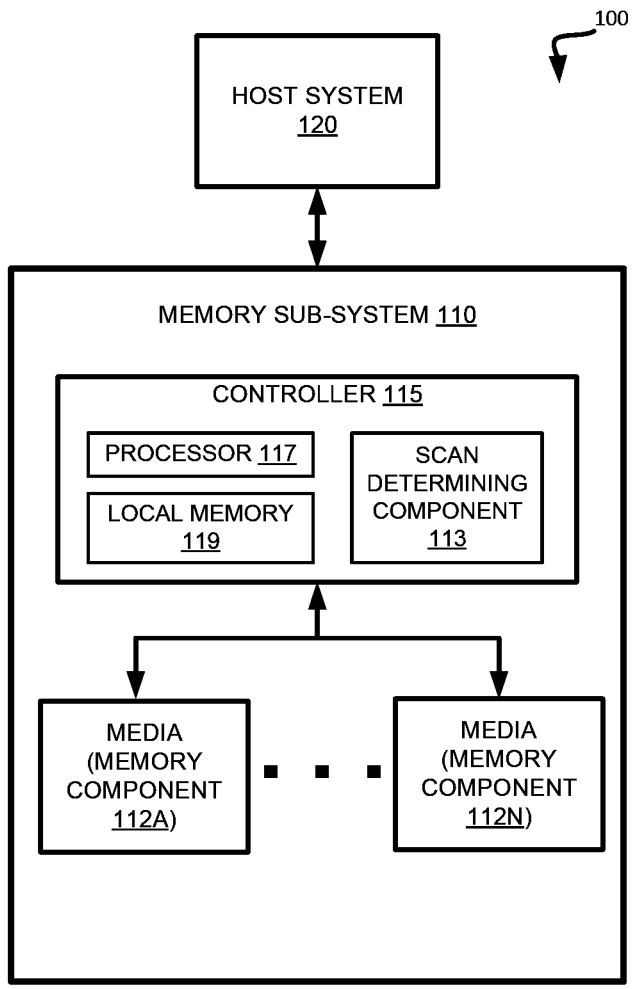
FIG. 1 illustrates an example computing environment that includes a memory sub-system in accordance with some embodiments of the present disclosure.

Aspects of the present disclosure are directed to read disturb scan consolidation across multiple planes of a memory component to minimize system bandwidth penalty in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A memory component can be a memory device, such as a non-volatile memory device. A non-volatile memory device is a package of one or more dice. Each die can be comprised of one or more planes. For some types of non-volatile memory devices (e.g., NAND devices), each plane is comprised of a set of physical blocks. For some memory devices, blocks are the smallest area than can be erased. Each block is comprised of a set of pages. Each page is comprised of a set of memory cells, which store bits of data. When data is written to a memory cell of the memory component for storage, the memory cell can deteriorate. Accordingly, each memory cell of the memory component can handle a finite number of write operations performed before the memory cell is no longer able to reliably store data. Data stored at the memory cells of the memory component can be read from the memory component and transmitted to a host system. When data is read from a memory cell of the memory component, nearby or adjacent memory cells can experience what is known as read disturb. Read disturb is the result of continually reading from one memory cell without intervening erase operations, causing other nearby memory cells to change over time (e.g., become programmed). If too many read operations are performed on a memory cell, data stored at adjacent memory cells of the memory component can become corrupted or incorrectly stored at the memory cell. This can result in a higher error rate of the data stored at the memory cell. This can increase the use of an error detection and correction operation (e.g., an error control operation) for subsequent operations (e.g., read and/or write) performed on the memory cell. The increased use of the error control operation can result in a reduction of the performance of a conventional memory sub-system. In addition, as the error rate for a memory cell or block continues to increase, it may even surpass the error correction capabilities of the memory sub-system, leading to an irreparable loss of the data. Furthermore, as more resources of the memory sub-system are used to perform the error control operation, fewer resources are available to perform other read operations or write operations.

The error rate associated with data stored at the block can increase due to read disturb. Therefore, upon a threshold number of read operations being performed on the block, the memory sub-system can perform a data integrity check (also referred to herein as a "scan") to verify that the data stored at the block does not include any errors. During the data integrity check, one or more reliability statistics are determined for data stored at the block. One example of a reliability statistic is raw bit error rate (RBER). The RBER corresponds to a number of bit errors per unit of time that the data stored at the block experiences.

Conventionally, if the reliability statistic for a block exceeds a threshold value, indicating a high error rate associated with data stored at the block due, at least in part, to read disturb, then the data stored at the block is relocated to a new block of the memory sub-system (also referred to herein as "folding"). The folding of the data stored at the block to the other block can include writing the data to the other block to refresh the data stored by the memory sub-system. This can be done to negate the effects of read disturb associated with the data and to erase the data at the block. However, as previously discussed, read disturb can affect memory cells that are adjacent to the memory cell that a read operation is performed on. Therefore, read disturb can induce a non-uniform stress on memory cells of the block if particular memory cells are read from more frequently. For example, memory cells of a block that are adjacent to a memory cell that is frequently read from can have a high error rate, while memory cells that are not adjacent to the memory cell can have a lower error rate due to a reduced impact by read disturb on these memory cells.

Depending on the data access activity of the host system for a particular memory sub-system, the effects of read disturb can be either focused on one or more particular memory pages in a block or distributed more evenly across all the memory pages of the block. If read stress is focused on a single memory page, for example, the block can be considered to be experiencing single word line (SWL) read disturb (also referred to as "row hammer" read disturb). Single word line read disturb can occur in situations where a certain piece of data stored in the memory sub-system is read significantly more often than the rest of the data in the same block. If the read stress is uniformly distributed across multiple memory pages, however, the block can be considered to be experiencing uniform read disturb (also referred to as "full block" read disturb). Uniform read disturb can occur in situations where each piece of data in a block is read with approximately the same frequency.

A conventional memory sub-system performs a data integrity check at the block level using a scan operation. Since scan operations are performed at the block level, the memory sub-system monitors the number of read operations performed on a particular block and performs a scan operation when the read count (i.e., the number of read operations) meets or exceeds a certain read threshold. Depending on the implementation, the memory sub-system can maintain a read counter or multiple read counters that track the number of read operations performed on segments of different granularities. For example, some systems may maintain a separate read counter for each physical block, while other systems may maintain a read counter for a super block (i.e., a collection of multiple physical blocks). In many cases, the available memory space (e.g., RAM) is insufficient to support the use of read counters for each physical block. In these situations, the memory sub-system can use read counters at the super block level. The controller firmware generally cannot distinguish between single word line read disturb stress and uniform read disturb stress, so it utilizes a conservative read threshold set based on single word line read disturb stress. When one word line in a physical block experiences single word line read disturb stress, the read count to trigger the scan can be anywhere from 2× to 50× lower than a word line in another physical block that only experiences uniform read disturb stress. If both physical blocks are part of the same super block and the memory sub-system maintains a common read counter for the super block, the threshold number of read operations will be met significantly faster than the actual number of reads seen by any of the individual physical blocks in the super block. Thus, although it may be appropriate to scan that one physical block, such a scan operation may not be necessary for the remainder of the physical blocks in the super block. Performing unnecessary scan operations in this manner can result in the performance of excessive memory management operations by the memory sub-system. This can result in a decrease of performance of the memory sub-system, as well as an increase in the power consumption of the memory sub-system. System bandwidth and other resources can also be tied up for extended periods of time, preventing the use of those resources for other functionality.

Aspects of the present disclosure address the above and other deficiencies by using read counters having tiered granularity, where the granularity is based on whether the corresponding block is storing recently written data. For blocks that are storing recently written data (i.e., open blocks), the memory sub-system may operate in a first mode of operation and utilize read counters at the physical block level to individually track the number of read operations performed on each physical block. When the age of the data increases and the blocks are no longer storing recently written data (i.e., closed blocks), such as if newer data has been written to other blocks on the memory component, the memory sub-system may switch to a second mode of operation and utilize read counters at the super block level to track the number of read operations performed on all of the blocks in the super block together. By tracking the read counts on closed blocks at the super block level, the memory sub-system reduces the memory space overhead required to maintain the read counters and frees that memory space for other data. By tracking the read counts on open blocks at the physical block level, the memory sub-system reduces the read count accumulation and reduces the frequency with which the data integrity scan is performed thereby increasing performance, decreasing power consumption and freeing system resources for other functionality. Thus, the memory controller will be occupied for less time when performing read disturb scans, thereby allowing more time for the controller to handle other data access operations for the memory component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or blocks that can refer to a unit of the memory component used to store data. The blocks can be further grouped into one or more planes on each of memory components 112A to 112N, where operations can be performed on each of the planes concurrently. Corresponding blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a scan determining component 113 that can be used to determine when to perform a scan or other data integrity check on the blocks of memory components 112A to 112N. In one embodiment, scan determining component 113 monitors the age of data stored in the blocks of memory components 112A to 112N and implements read counters having tiered granularity for tracking the number of read operations performed. The number of read operations performed is one metric that scan determining component 113 can use to determine when to perform a data integrity scan. In one implementation, the read counters are maintained in local memory 119. For blocks that are storing recently written data (i.e., open blocks), scan determining component 113 can utilize read counters at the physical block level to track the number of read operations performed on each physical block separately. In other implementations, scan determining component 113 can utilize read counters and some other level of granularity, such as per word line, per group of word lines, or per some other storage unit. When read counters are maintained for smaller storage units, the accumulation rate is lower and fewer word lines can be scanned during a data integrity scan. Thus, when a read operation is performed on a certain physical block, a corresponding read counter for that physical block is incremented by a defined amount (e.g., 1). When the age of the data increases and the blocks are no longer storing recently written data (i.e., closed blocks), such as if newer data has been written to other blocks on the memory component, scan determining component 113 can utilize read counters at the super block level to track the number of read operations performed on all of the blocks in the super block together. Thus, when a read operation is performed on any block that is part of the super block, a corresponding read counter for that super block is incremented. If scan determining component 113 determines that the read count (i.e., either for an individual physical block or a super block) satisfies a first threshold criteria (e.g., exceeds a first read threshold), scan determining component 113 can perform a data integrity scan to determine an error rate for either the one physical block or all of the blocks in the super block, as appropriate. Upon determining the corresponding error rates, scan determining component 113 can determine whether any of the error rates exceed an error threshold and can relocate data from those blocks and reset the read counts of those blocks. Further details with regards to the operations of the scan determining component 113 are described below.

Figure 2:
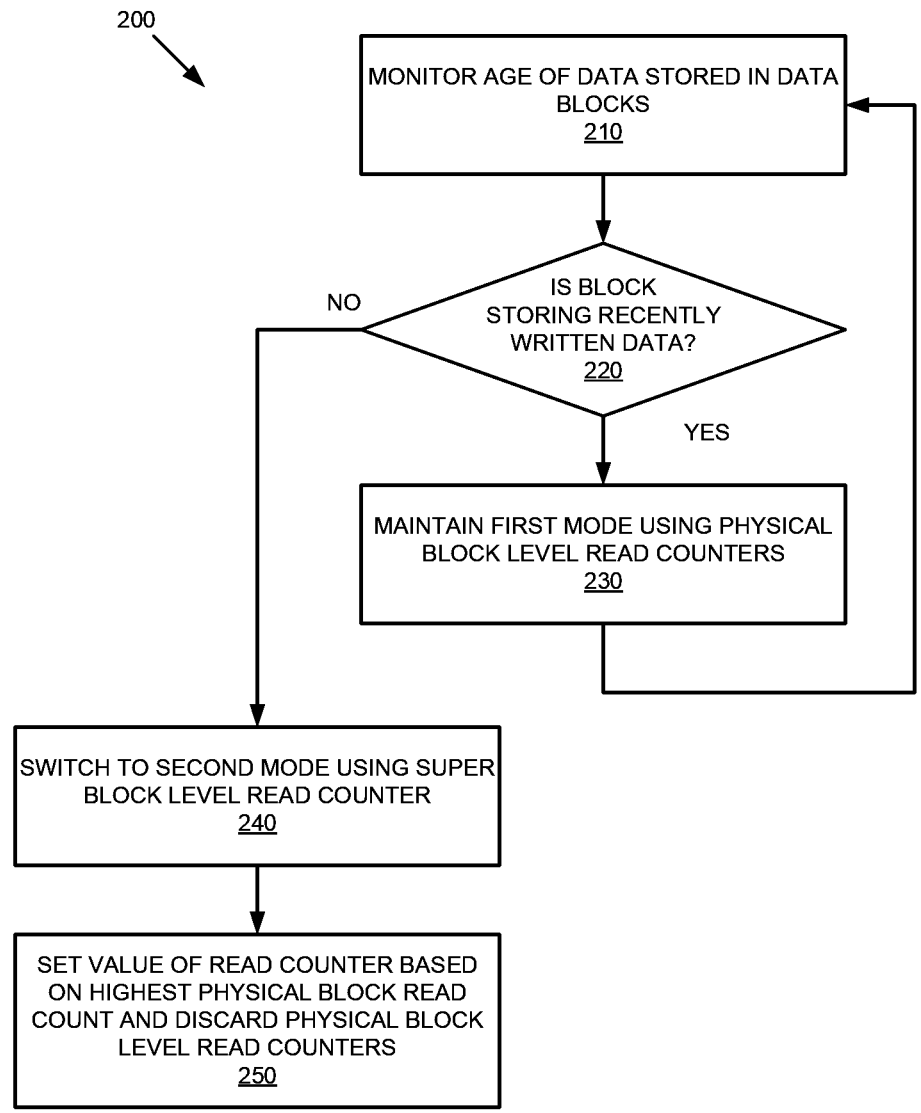
FIG. 2 is a flow diagram of an example method of using read counters having tiered granularity in accordance with some embodiments of the present disclosure.

FIG. 2 is a flow diagram of an example method of using read counters having tiered granularity in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device monitors the age of data stored in various blocks on memory components 112A to 112N. In one embodiment, controller 115 maintains an index of all blocks stored on memory components 112A to 112N. For example, the index can include a list of the blocks and a sequential index number assigned to each of blocks. As new blocks are written on memory components 112A to 112N controller 115 can add a corresponding entry to the index and assign an index number. The index number can have a value that is increment by one unit each time a new index number is assigned. Thus, the value of the index number is indicative of the age of data stored on a block, as more recently written blocks can be assigned a higher index number than previously written blocks. When a block is erased and/or overwritten with new data, controller 115 can assign a new index number to the blocks. In one embodiment, controller 115 maintains the index in local memory 119.

At operation 220, the processing device determines whether a particular block is storing recently written data. In one embodiment, scan determining component 113 maintains a threshold criterion pertaining to the age of the data, where the threshold criterion is used to determine whether the data is recently written or not. For example, the threshold criterion can include an index number representing a certain amount of recently written data. In one embodiment, the threshold criterion can be defined in view of a number of blocks that together store a certain amount of data (e.g., 1 gigabyte). Thus, scan determining component 113 can determine the index number of a certain block, determine a difference between that index number and the highest index number in the index, and compare that difference to the threshold criterion. For example, if a certain block has an index number of 966, the highest index number is 972 meaning there is a difference of 6, and if the threshold criterion is set at 24 blocks, scan determining component 113 can determine that the data stored in the block satisfies the threshold criterion (i.e., is less than or equal to the threshold number of blocks). In contrast, if the difference is greater than the threshold number of blocks, the data can be considered to not satisfy the threshold criterion.

If the block is storing recently written data, at operation 230, the processing device maintains a first mode of operation and uses physical block level read counters to track a number of read operations performed on the block. FIG. 3 is a block diagram illustrating read counters at the physical block level in accordance with some embodiments of the present disclosure. As illustrated, there are a number of logical super blocks S1, S2, S3 each comprising a number of physical blocks P0, P1 striped across multiple logical unit numbers (LUNs) LUN1, LUN2, LUN3, LUN4. In one embodiment, the physical blocks are part of a stripe of blocks across multiple LUNs (or planes) of the memory component. This stripe can also be referred to as a super block. In one embodiment, in the first mode of operation, scan determining component 113 maintains a separate read counter C1-C8 in local memory 119 for each of the physical blocks P0, P1 in each of the LUNs of super block S1. If any one of the blocks in a given super block is storing recently written data, scan determining component 113 can use separate physical block level counters for each of the blocks in the super block. Each time a read operation is performed on a certain block (e.g., P0 of LUN1), scan determining component 113 can increment a corresponding physical block level read counter (e.g., C1).

If the block is not storing recently written data, at operation 240, the processing devices switches to a second mode of operation and uses a super block level read counter to track a number of read operations performed on the super block. As illustrated in FIG. 3, if none of the blocks in a given super block are storing recently written data, scan determining component 113 can use a single super block level counter (e.g., C9 or C10) for all of the blocks in the super block (e.g., S2 or S3). Each time a read operation is performed on any of the blocks in the super block, scan determining component 113 can increment a corresponding super block level read counter (e.g., C9 or C10).

At operation 250, the processing device sets the value of the super block level read counter based on a highest value of any of the physical block level read counters corresponding to the physical blocks in the super block. When converting from the first mode to the second mode, such as if the data in a super block has aged and no longer qualifies as recently written data, scan determining component 113 can use the values of the physical block level read counters to determine the value of the super block level read counter. For example, if super block S1 is determined not to include any recently written data at some point in time, scan determining component 113 can identify the highest read count value from any of counters C1-C8 and use that value as the value of a new super block level read counter for super block S1.

Figure 4:
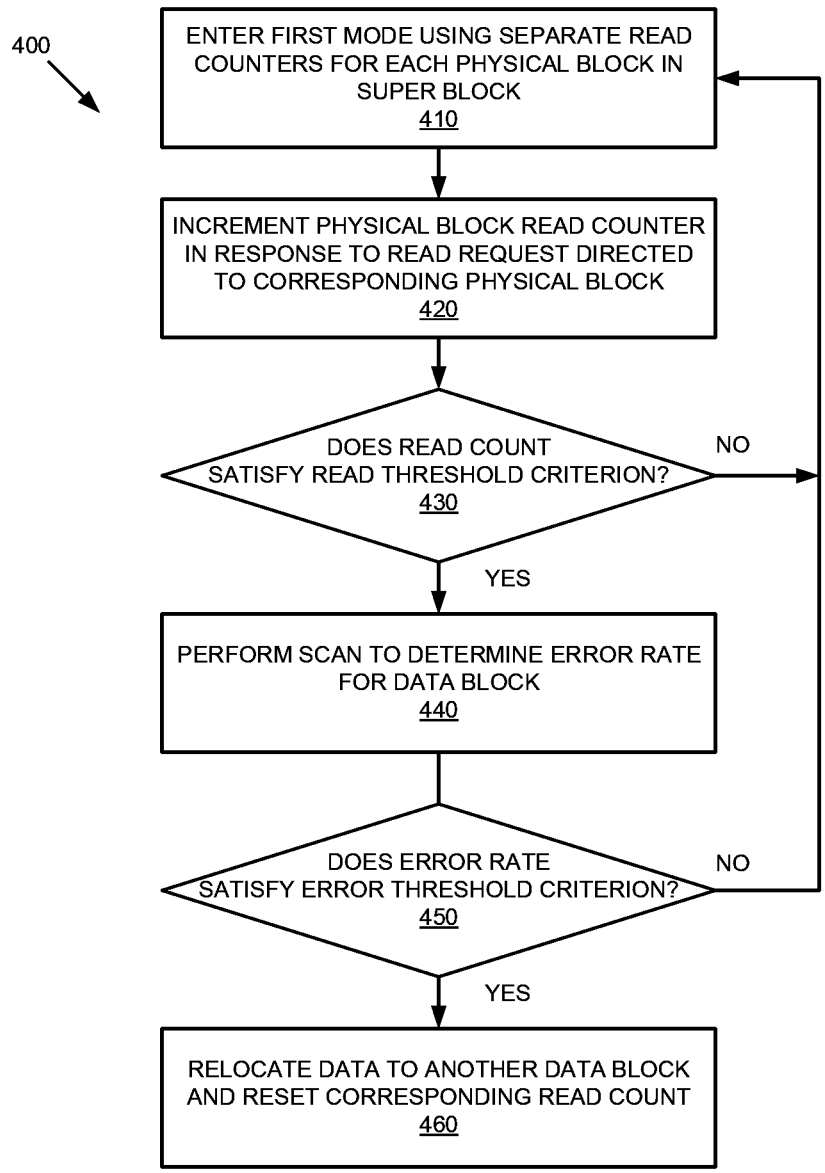
FIG. 4 is a flow diagram of an example method of using read counters at a physical block level granularity to trigger a data integrity scan in accordance with some embodiments of the present disclosure.

FIG. 4 is a flow diagram of an example method of using read counters at a physical block level granularity to trigger a data integrity scan in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device enters a first mode using separate read counters for each physical block in a super block. As described above, if any one of the blocks (e.g., P0-P1 on LUN1-LUN4 in a given super block S1 is storing recently written data, scan determining component 113 can use separate physical block level counters C1-C8 for each of the blocks in the super block. At operation 420, the processing device increments the physical block level read counter in response to receiving a read request directed to a corresponding block. For example, controller 115 can receive a read request indicating a particular logical data address and can determine the corresponding physical block address of that data. Controller 115 can then perform a read operation on that block (e.g., P0 of LUN1 in super block S1), and scan determining component 113 can increment a corresponding physical block level read counter (e.g., C1).

At operation 430, the processing device determines whether the value of the read counter C1 (i.e., the read count) satisfies a read threshold criterion (i.e., meets or exceeds a first read threshold). The read count represents a number of times that the first block (e.g., P0 of LUN1) has been read since a previous scan operation or data integrity check was performed on the first block, at which time the read count would have been reset. In other implementations, the read counters are not reset when a scan operation or data integrity check is performed, but instead the read count threshold is incremented by a threshold amount. The first read threshold can represent a number of read operations on a given memory block after which a scan or other data integrity check should be performed. In one embodiment, scan determining component 113 compares the read count to the first read threshold to determine whether the read count meets or exceeds the first read threshold. If the read count does not meet or exceed the first read threshold, the processing device returns to operation 410 and continues monitoring the read count values of the blocks on the memory component. In another embodiment, the first threshold criterion includes the read count being below the first read threshold, such that if the read count does not satisfy the first threshold criterion, the processing device continues to operation 440.

If the read threshold criterion is satisfied, at operation 440, the processing device performs a data integrity scan to determine an error rate for the block. The error rate associated with data stored at the block can increase due to read disturb. Therefore, upon a threshold number of read operations being performed on the block, the memory sub-system 110 can perform a scan or other data integrity check to verify that the data stored at the block does not include any errors, or that the number of errors are suitably low. During the scan, scan determining component 113 identifies one or more reliability statistics, such as the raw bit error rate (RBER) representing a number of bit errors per unit of time that the data stored at the block experiences. In one embodiment, during the scan, scan determining component 113 reads a raw code word (i.e., a series of a fixed number of bits) from the block. Scan determining component 113 can apply the code word to an error correcting code (ECC) decoder to generate a decoded code word and compare the decoded code word to the raw code word. Scan determining component 113 can count a number of flipped bits between the decoded code word and the raw code word, with a ratio of the number of flipped bits to the total number of bits in the code word representing the RBER. Scan determining component 113 can repeat this process for additional code words until the entire block has been scanned.

At operation 450, the processing device determines whether the error rate for the block satisfies an error threshold criterion (i.e., meets or exceeds an error threshold). In one embodiment, scan determining component 113 compares the error rate to the error threshold which represents an error correction capability of the memory component. If the error rate does not meet or exceed the error threshold, the processing device returns to operation 410 and continues monitoring the read count values of the blocks on the memory component. In another embodiment, the error threshold criterion includes the error rate being below the error threshold, such that if the error rate does not satisfy the error threshold criterion, the processing device continues to operation 460.

If the error threshold criterion is satisfied, at operation 460, the processing device relocates the data from the block to another block and resets the read count value of read counter C1 (e.g., to 0 or to some other initial value). In one embodiment, scan determining component 113 reads data stored in the corresponding block (i.e., the block for which the error rate meets or exceeds the error threshold) and writes that data to another block. Once the data has been written to the other block, the data stored in the initial block is erased and the initial block is available to be programmed with new data. Depending on the embodiment, the data is relocated to another block of the same plane of the same memory component, to another plane on the same memory component, or to a different memory component of the memory sub-system 110.

Figure 5:
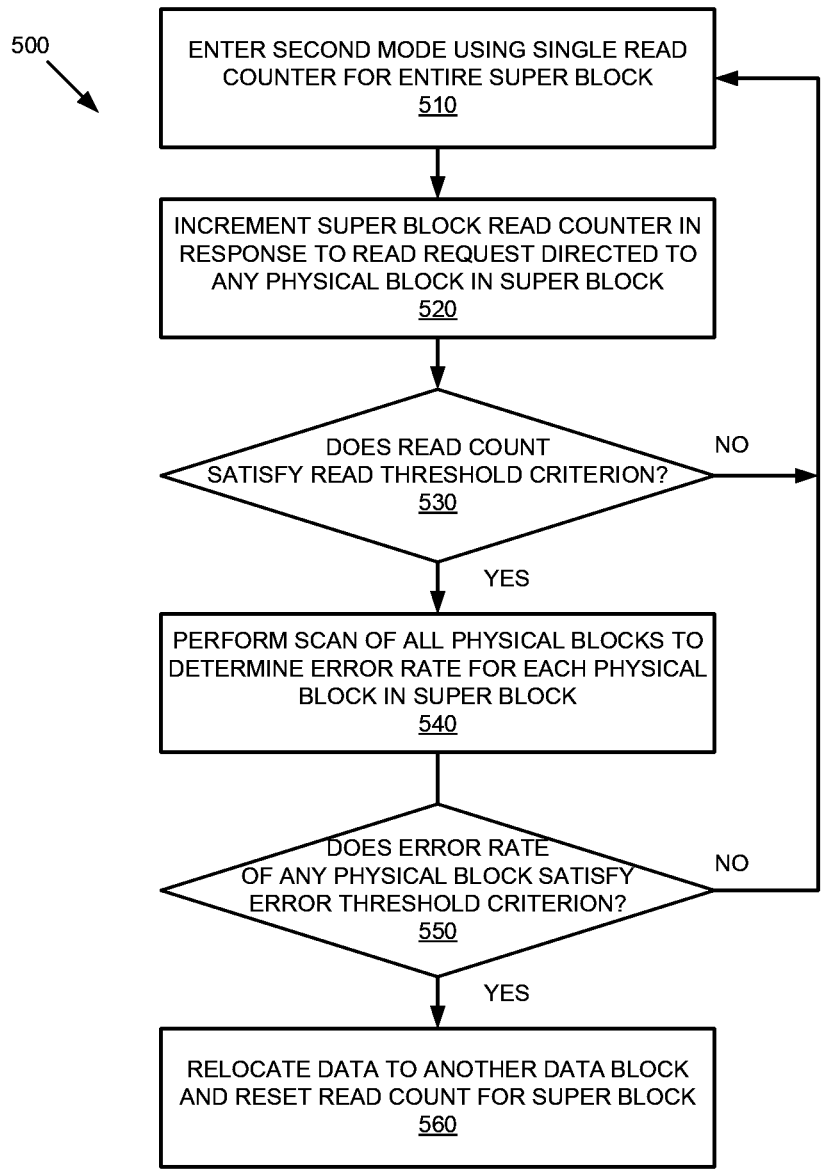
FIG. 5 is a flow diagram of an example method of using read counters at a super block level granularity to trigger a data integrity scan in accordance with some embodiments of the present disclosure.

FIG. 5 is a flow diagram of an example method of using read counters at a super block level granularity to trigger a data integrity scan in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device enters a second mode using a single read counter for each super block. As described above, if none of the blocks (e.g., P0-P1 on LUN1-LUN4 in a given super block S2 are storing recently written data, scan determining component 113 can use a single super block level counters C9 for the super block S2. At operation 520, the processing device increments the super block level read counter C9 in response to receiving a read request directed to any block in the super block S2. For example, controller 115 can receive a read request indicating a particular logical data address and can determine the corresponding physical block address of that data. Controller 115 can then perform a read operation on that block (e.g., P0 of LUN1 in super block S2), and scan determining component 113 can increment a corresponding super block level read counter (e.g., C9).

At operation 530, the processing device determines whether the value of the read counter C9 (i.e., the read count) satisfies a read threshold criterion (i.e., meets or exceeds a first read threshold). The read count represents a number of times that any of the blocks in the corresponding super block S2 have been read since a previous scan operation or data integrity check was performed on the blocks, at which time the read count would have been reset. The first read threshold can represent a number of read operations on a given memory block after which a scan or other data integrity check should be performed. In one embodiment, scan determining component 113 compares the read count to the first read threshold to determine whether the read count meets or exceeds the first read threshold. If the read count does not meet or exceed the first read threshold, the processing device returns to operation 510 and continues monitoring the read count values of the blocks on the memory component. In another embodiment, the first threshold criterion includes the read count being below the first read threshold, such that if the read count does not satisfy the first threshold criterion, the processing device continues to operation 540.

If the read threshold criterion is satisfied, at operation 540, the processing device performs a data integrity scan to determine an error rate for each physical block in the super block S2. During the scan, scan determining component 113 identifies one or more reliability statistics, such as the raw bit error rate (RB ER) representing a number of bit errors per unit of time that the data stored at the block experiences. In one embodiment, during the scan, scan determining component 113 reads a raw code word (i.e., a series of a fixed number of bits) from the block. Scan determining component 113 can apply the code word to an error correcting code (ECC) decoder to generate a decoded code word and compare the decoded code word to the raw code word. Scan determining component 113 can count a number of flipped bits between the decoded code word and the raw code word, with a ratio of the number of flipped bits to the total number of bits in the code word representing the RB ER. Scan determining component 113 can repeat this process for additional code words until each block in the super block has been scanned.

At operation 550, the processing device determines whether the error rate for any of the physical blocks satisfies an error threshold criterion (i.e., meets or exceeds an error threshold). In one embodiment, scan determining component 113 compares the error rates of the blocks to the error threshold which represents an error correction capability of the memory component. If the error rate for a particular block does not meet or exceed the error threshold, the processing device returns to operation 510 and continues monitoring the read count values of the blocks on the memory component. In another embodiment, the error threshold criterion includes the error rate being below the error threshold, such that if the error rate does not satisfy the error threshold criterion, the processing device continues to operation 560.

If the error threshold criterion is satisfied, at operation 560, the processing device relocates the data from the block to another block and resets the read count value of read counter C9 (e.g., to 0 or to some other initial value). In one embodiment, scan determining component 113 reads data stored in the corresponding block (i.e., the block for which the error rate meets or exceeds the error threshold) and writes that data to another block. Once the data has been written to the other block, the data stored in the initial block is erased and the initial block is available to be programmed with new data. Depending on the embodiment, the data is relocated to another block of the same plane of the same memory component, to another plane on the same memory component, or to a different memory component of the memory sub-system 110.

Figure 6:
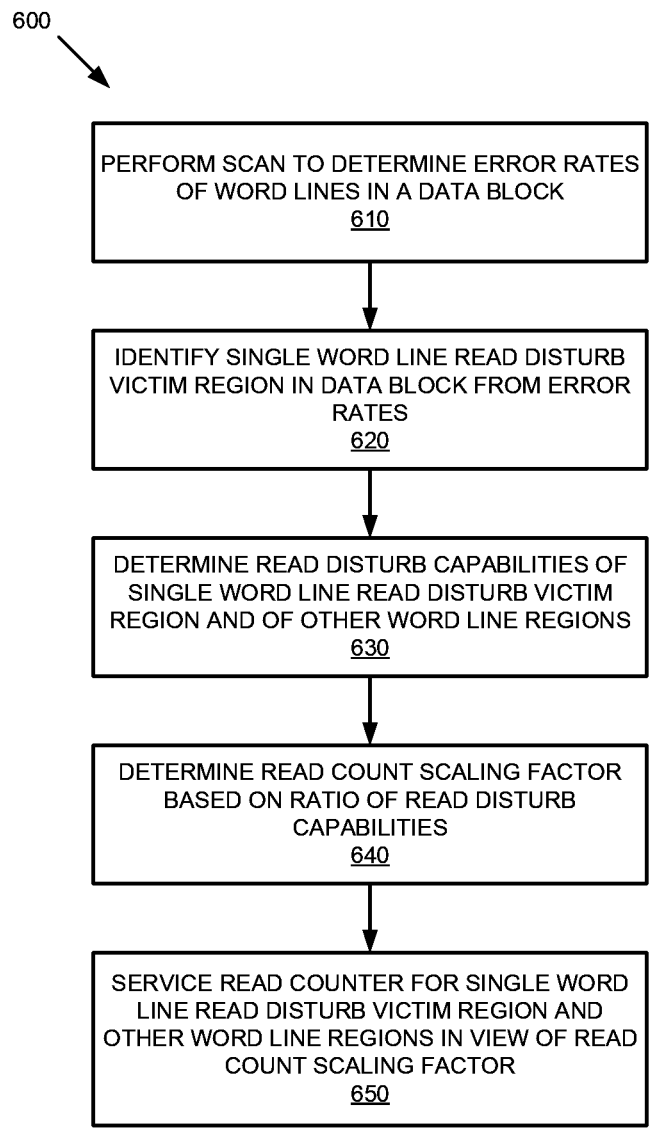
FIG. 6 is a flow diagram of an example method of determining a read count scaling factor in accordance with some embodiments of the present disclosure.

FIG. 6 is a flow diagram of an example method of determining a read count scaling factor in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing device performs a data integrity scan to identify one or more reliability statistics, such as the RBER, associated with each word line in a block. In one embodiment, during the scan, scan determining component 113 reads a raw code word (i.e., a series of a fixed number of bits) from each word line, applies the code word to an ECC decoder to generate a decoded code word and compares the decoded code word to the raw code word. Scan determining component 113 can count a number of flipped bits between the decoded code word and the raw code word, with a ratio of the number of flipped bits to the total number of bits in the code word representing the RBER. Scan determining component 113 can repeat this process for additional code words until each word line in the block has been scanned.

At operation 620, the processing device identifies one or more single word line read disturb victim regions in the block using the determined error rates. The single word line read disturb victim regions can have error rates that are significantly higher than other word line regions. In one embodiment, scan determining component 113 can compare the determined error rates of each word line to one another and identify the highest error rates. For example, scan determining component can identify word lines having a determined error rate that exceeds an average of all word line error rates by a certain threshold amount as word lines that make up a single word line read disturb victim region. In one embodiment, word lines with an error rate above a first threshold can be considered part of a single word line read disturb victim region and word lines with an error rate below a second threshold can be considered part of the other word line region.

At operation 630, the processing device determines read disturb capabilities of the one or more single word line read disturb victim regions and of other word line regions that were not subject to single word line read disturb. In one embodiment, scan determining component 113 compares the determined error rate for each of the word lines to an error threshold for the block to normalize the results. Scan determining component 113 can determine a percentage of the error threshold which the determined error rate represents for a corresponding word line. For example, if the error threshold is 200 and the determined error rate for a word line is 20, the resulting percentage is 10%. The remaining percentage (i.e., 90%) represents the read disturb capability of the word line. In one embodiment, scan determining component 113 makes a similar determination for each of the one or more single word line read disturb victim regions and the other word line regions. For example, a word line from the single word line read disturb victim region can have an error rate of 180, giving a percentage of 90%, which indicates a read disturb capability of 10%. In one embodiment, word lines with a read disturb capability below a first threshold can be considered part of a single word line read disturb victim region and word lines with a read disturb capability above a second threshold can be considered part of the other word line region.

Figure 7:
FIG. 7 is a block diagram illustrating a data structure for storing a read count scaling factor in accordance with some embodiments of the present disclosure.

At block 640, the processing device determines a read count scaling factor based on a ratio of the read disturb capability of the other word line regions to the read disturb capability of the one or more single word line read disturb victim regions. In one embodiment, scan determining component 113 determines a first average read disturb capability for all of the word lines determined to be part of the other word line regions and a second average read disturb capability for all of the word lines determined to be part of the one or more single word line read disturb victim regions. In another embodiment, scan determining component 113 determines a first maximum read disturb capability for all of the word lines determined to be part of the other word line regions and a second maximum read disturb capability for all of the word lines determined to be part of the one or more single word line read disturb victim regions. Scan determining component 113 can determine a ratio of the first maximum to the second maximum, where the determined ratio can be used as the read count scaling factor. For example, if the first maximum is 90% and the second maximum is 10%, the determined read count scaling factor is 9. In one embodiment, scan determining component 113 can store an indication of the read count scaling factor in data structure 700, as illustrated in FIG. 7. FIG. 7 is a block diagram illustrating a data structure 700 for storing a read count scaling factor in accordance with some embodiments of the present disclosure. In one embodiment, data structure includes an entry corresponding to each section (e.g., a block) on a memory component and can be stored, for example, in local memory 119. As illustrated, each entry can include an identifier of the corresponding section, a current read count for that section, a defined scan threshold for that section, an indication of the one or more single word line read disturb victim regions in that section, and the determined scaling factor for that section.

Referring again to FIG. 6, at block 650, the processing device services a read counter for the one or more single word line read disturb victim regions and the other word line regions in view of the read count scaling factor. In one embodiment, for each read operation directed to a word line in the one or more single word line read disturb victim regions, scan determining component 113 can increment a read counter for the block by a default amount (e.g., 1) and for each read operation directed to a word line in the other word line regions, scan determining component 113 can increment a read counter for the block by a scaled amount (e.g., ⅛). Additional details pertaining to the use of this read count scaling factor are described below in connection with FIG. 8.

Figure 8:
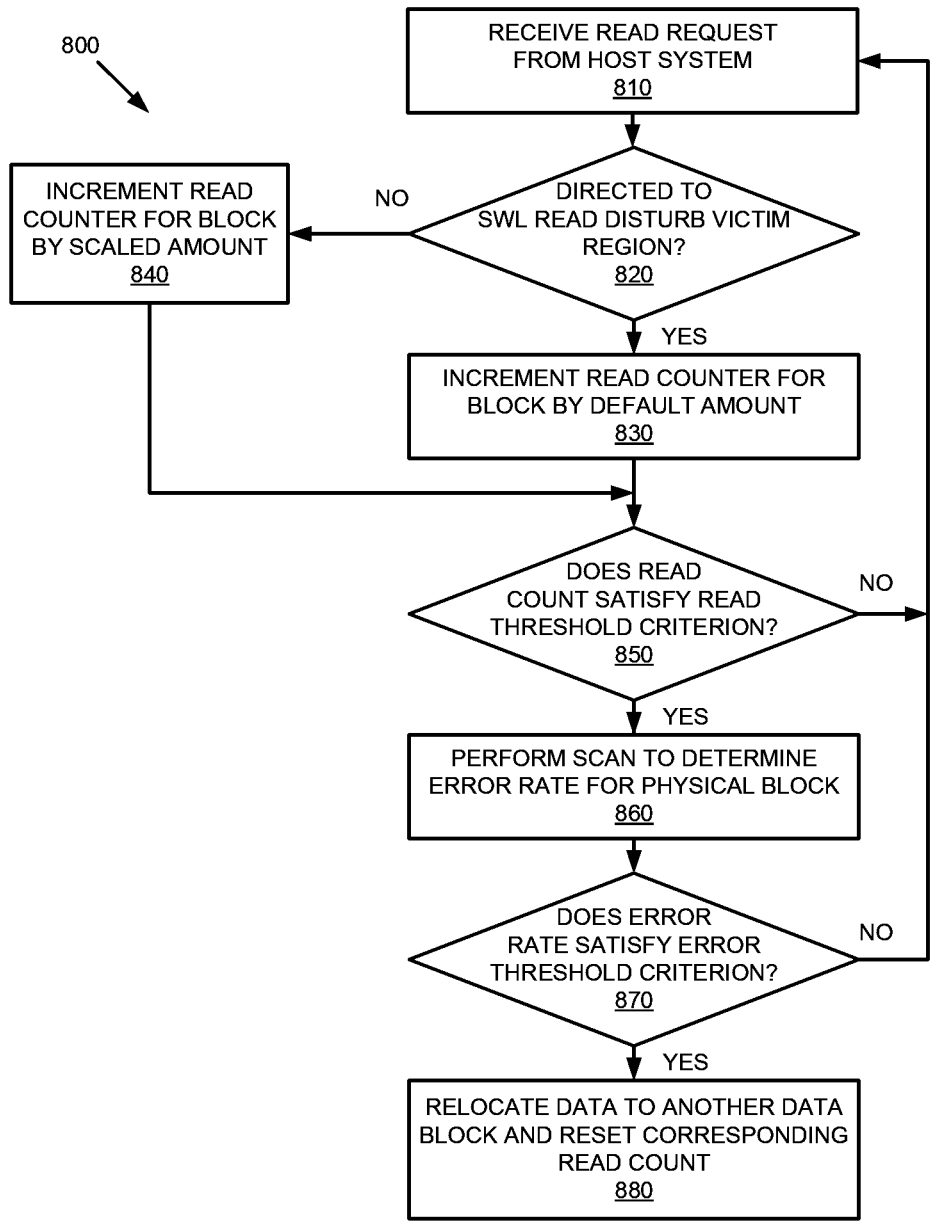
FIG. 8 is a flow diagram of an example method of using a read count scaling factor when incrementing a read counter to trigger a data integrity scan in accordance with some embodiments of the present disclosure.

FIG. 8 is a flow diagram of an example method of using a read count scaling factor when incrementing a read counter to trigger a data integrity scan in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing device receives a read request from host system 120 or from some other component of memory sub-system 110. At operation 820, the processing device determines whether the read request is directed to data stored in the single word line read disturb victim region. In one embodiment, controller 115 can receive a read request indicating a particular logical data address and can determine the corresponding physical block address of that data. As described above, data structure 700 can include an indication the one or more single word line read disturb victim regions in that section. Thus, controller 115 can determine that the data identified in the read request is stored in a single word line read disturb victim region if the physical address is part of a range of addresses identified in data structure 700. Otherwise, controller 115 considers the read request to be directed to the other word line regions of the block.

If the read request is directed to data stored in the single word line read disturb victim region, at operation 830, the processing device increments a read counter for the block by a default amount. In one embodiment, scan determining component increments the read counter in the data structure 700 corresponding to the identified block by the default amount (e.g., 1). The default amount is a configurable parameter and can have other values in other embodiments.

If the read request is not directed to data stored in the single word line read disturb victim region, at operation 840, the processing device increments a read counter for the block by a scaled amount. In one embodiment, the scaled amount includes a value representing the reciprocal of the scaling factor. For example if the determined scaling factor is 9, the scaled amount can be ⅑.

At operation 850, the processing device determines whether the value of the read counter (i.e., the read count) satisfies a read threshold criterion (i.e., meets or exceeds a first read threshold). The read count represents a number of times that the block has been read since a previous scan operation or data integrity check was performed on the block, at which time the read count would have been reset. The first read threshold can represent a number of read operations on a given memory block after which a scan or other data integrity check should be performed. In one embodiment, scan determining component 113 compares the read count to the first read threshold to determine whether the read count meets or exceeds the first read threshold. If the read count does not meet or exceed the first read threshold, the processing device returns to operation 810 and waits to receive another read request from host system 120.

If the read threshold criterion is satisfied, at operation 860, the processing device performs a data integrity scan to determine an error rate for the block. The error rate associated with data stored at the block can increase due to read disturb. Therefore, upon a threshold number of read operations being performed on the block, the memory sub-system 110 can perform a scan or other data integrity check to verify that the data stored at the block does not include any errors, or that the number of errors are suitably low. During the scan, scan determining component 113 identifies one or more reliability statistics, such as the RBER representing a number of bit errors per unit of time that the data stored at the block experiences. In one embodiment, during the scan, scan determining component 113 reads a raw code word (i.e., a series of a fixed number of bits) from the block. Scan determining component 113 can apply the code word to an ECC decoder to generate a decoded code word and compare the decoded code word to the raw code word. Scan determining component 113 can count a number of flipped bits between the decoded code word and the raw code word, with a ratio of the number of flipped bits to the total number of bits in the code word representing the RBER. Scan determining component 113 can repeat this process for additional code words until the entire block has been scanned.

At operation 870, the processing device determines whether the error rate for the block satisfies an error threshold criterion (i.e., meets or exceeds an error threshold). In one embodiment, scan determining component 113 compares the error rate to the error threshold which represents an error correction capability of the memory component. If the error rate does not meet or exceed the error threshold, the processing device returns to operation 810 and waits to receive another read request from host system 120.

If the error threshold criterion is satisfied, at operation 880, the processing device relocates the data from the block to another block and resets the read count value of read counter (e.g., to 0 or to some other initial value). In one embodiment, scan determining component 113 reads data stored in the block and writes that data to another block. Once the data has been written to the other block, the data stored in the initial block is erased and the initial block is available to be programmed with new data. Depending on the embodiment, the data is relocated to another block of the same plane of the same memory component, to another plane on the same memory component, or to a different memory component of the memory sub-system 110.

Figure 9:
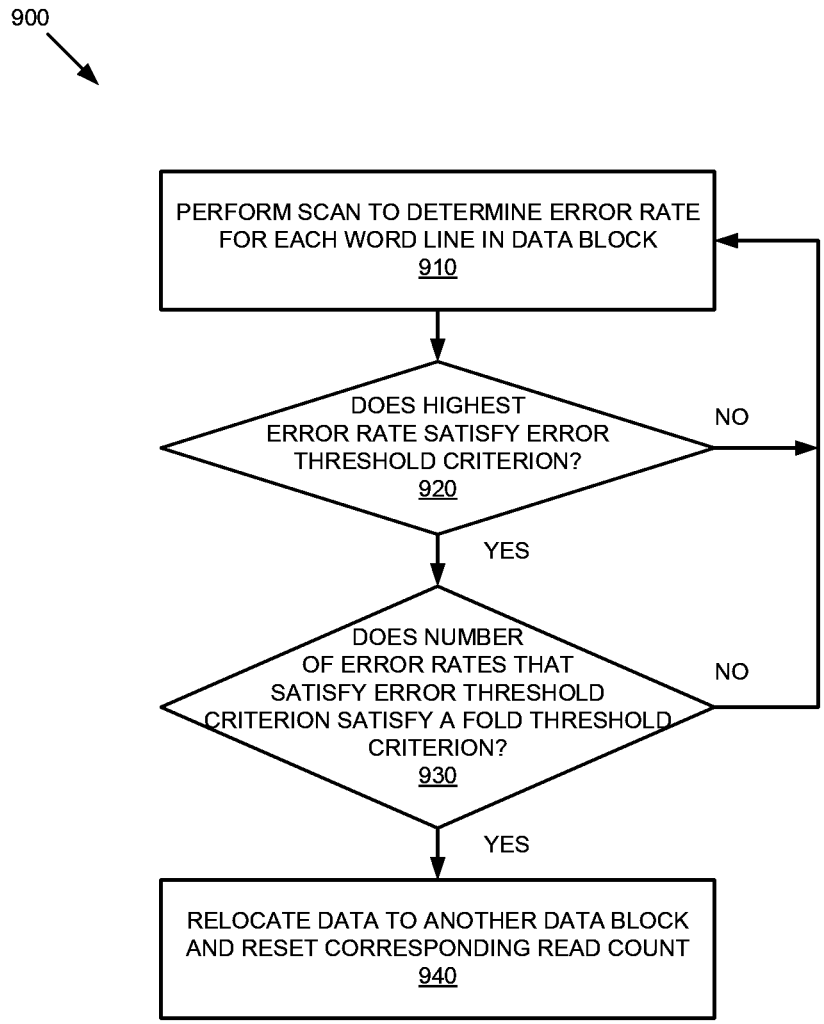
FIG. 9 is a flow diagram of an example method of using a tiered criterion for block refresh after a data integrity scan in accordance with some embodiments of the present disclosure.

FIG. 9 is a flow diagram of an example method of using a tiered criterion for block refresh after a data integrity scan in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the scan determining component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing device performs a data integrity scan to determine an error rate for each word line on the block. The error rate associated with data stored at the block can increase due to read disturb. Therefore, upon a threshold number of read operations being performed on the block, the memory sub-system 110 can perform a scan or other data integrity check to verify that the data stored at the block does not include any errors, or that the number of errors are suitably low. During the scan, scan determining component 113 identifies one or more reliability statistics, such as the RBER representing a number of bit errors per unit of time that the data stored at the block experiences. In one embodiment, during the scan, scan determining component 113 reads a raw code word (i.e., a series of a fixed number of bits) from the block. Scan determining component 113 can apply the code word to an ECC decoder to generate a decoded code word and compare the decoded code word to the raw code word. Scan determining component 113 can count a number of flipped bits between the decoded code word and the raw code word, with a ratio of the number of flipped bits to the total number of bits in the code word representing the RBER. Scan determining component 113 can repeat this process for additional code words until each word line in the block has been scanned.

At operation 920, the processing device determines whether the highest error rate for a particular word line in the block satisfies an error threshold criterion (i.e., meets or exceeds an error threshold). In one embodiment, scan determining component 113 compares the highest error rate for a given word line in the block to the error threshold which represents an error correction capability of the memory component. If the highest error rate does not meet or exceed the error threshold, the processing device returns to operation 810 and waits to receive another read request from host system 120.

If the highest error rate for the block satisfies the error threshold criterion, at operation 930, the processing device determines how many word lines have error rates that satisfy the error threshold criterion and determines whether that number of word lines satisfies a fold threshold criterion. In general, the error threshold criterion is typically based on the ECC decoder's hard decode threshold in order to minimize error handling trigger rates. In practice though, there can be significant read disturb margin for read retries and soft decode capability. The word line with the highest error rate in the block can be affected by localized read stress (e.g., single word line read disturb stress) or can be intrinsically weaker than other word lines. As such, refreshing the whole block on the basis of this one word line may be unnecessary. Accordingly, scan determining component 113 can determine whether a threshold number of word lines have an error rate that exceeds the error threshold before deciding to refresh the block. If the number of word lines with a high error rate does not satisfy the fold threshold criterion, scan determining component can rely on the error handling process built in to memory subsystem 110 to handle those errors.

If the number of word lines with a high error rate does satisfy the fold threshold criterion though, at operation 940, the processing device relocates the data from the block to another block and resets the read count value of read counter (e.g., to 0 or to some other initial value). In one embodiment, scan determining component 113 reads data stored in the block and writes that data to another block. Once the data has been written to the other block, the data stored in the initial block is erased and the initial block is available to be programmed with new data. Depending on the embodiment, the data is relocated to another block of the same plane of the same memory component, to another plane on the same memory component, or to a different memory component of the memory sub-system 110.

Figure 10:
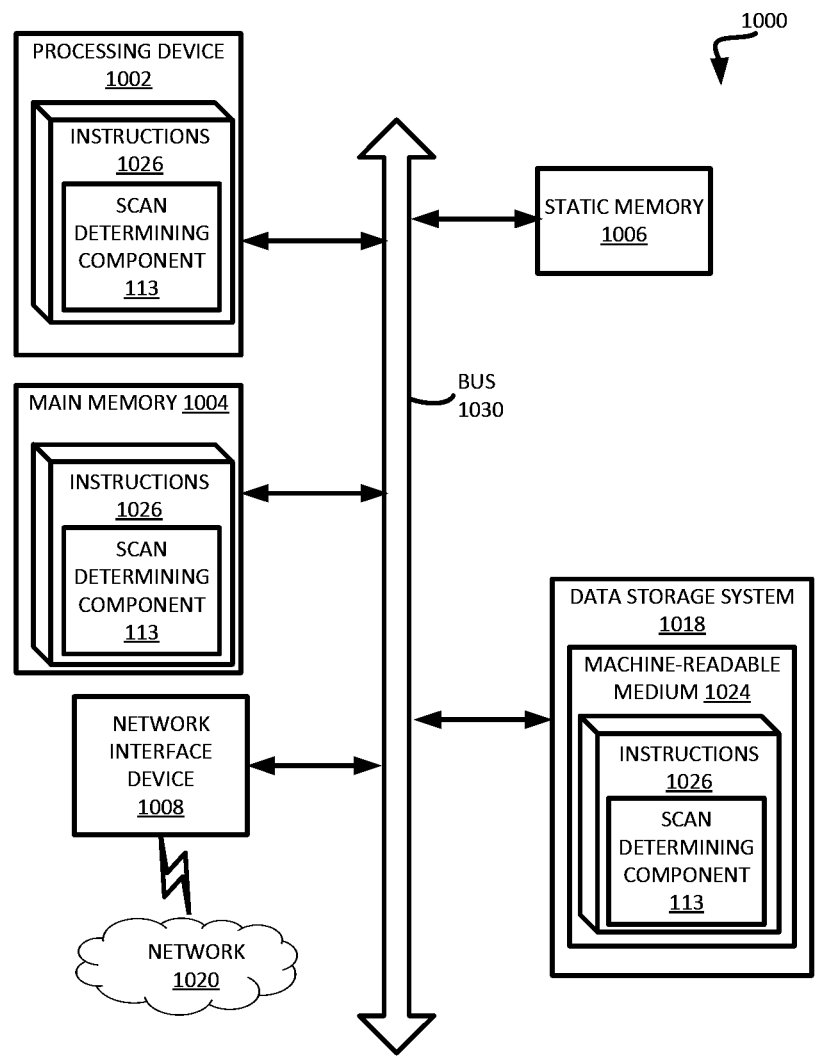
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan determining component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory sub-system 110 of FIG. 1.

In one embodiment, the instructions 1026 include instructions to implement functionality corresponding to the scan determining component 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
maintaining a counter to track a number of read operations performed on at least one of a physical block or a plurality of physical blocks of a memory device, wherein the counter is associated with the physical block or the plurality of physical blocks depending on an age of data stored on the physical block;
determining whether a value of the counter satisfies a first threshold criterion pertaining to the number of read operations performed; and
responsive to the value of the counter satisfying the first threshold criterion, performing a data integrity scan to determine a first error rate.

2. The method of claim 1, further comprising:
determining that the data stored on the physical block satisfies a second threshold criterion pertaining to the age of the data; and
responsive to the data stored on the physical block satisfying the second threshold criterion, maintaining the counter to track the number of read operations performed on the physical block.

3. The method of 1, further comprising:
determining that the data stored on the physical block does not satisfy a second threshold criterion pertaining to the age of the data; and
responsive to the data stored on the physical block not satisfying the second threshold criterion, maintaining the counter to track the number of read operations performed on the plurality of blocks.

4. The method of claim 1, wherein the age of the data is based on an index number associated with the physical block, the index number representing how recently the data was written to the physical block relative to other physical blocks of the memory device.

5. The method of claim 1, further comprising:
incrementing the value of the counter responsive to receiving a read request directed to the at least one of the physical block or the plurality of physical blocks of the memory device.

6. The method of claim 1, wherein determining whether the value of the counter satisfies the first threshold criterion comprises determining whether the value of the counter meets or exceeds a first read threshold.

7. The method of claim 1, wherein performing the data integrity scan comprises:
determining whether the first error rate satisfies an error threshold criterion; and
responsive to the first error rate satisfying the error threshold criterion:
relocating the data stored on the at least one of the physical block or the plurality of physical blocks to one or more others blocks of the memory device; and
resetting the value of the counter to an initial value.

8. A system comprising:
a memory device; and
a processing device, operatively coupled with the memory device, to perform operations comprising:
maintaining a counter to track a number of read operations performed on at least one of a physical block or a plurality of physical blocks of the memory device, wherein the counter is associated with the physical block or the plurality of physical blocks depending on an age of data stored on the physical block;
determining whether a value of the counter satisfies a first threshold criterion pertaining to the number of read operations performed; and
responsive to the value of the counter satisfying the first threshold criterion, performing a data integrity scan to determine a first error rate.

9. The system of claim 8, wherein the processing device to perform operations further comprising:
determining that the data stored on the physical block satisfies a second threshold criterion pertaining to the age of the data; and
responsive to the data stored on the physical block satisfying the second threshold criterion, maintaining the counter to track the number of read operations performed on the physical block.

10. The system of claim 8, wherein the processing device to perform operations further comprising:
- determining that the data stored on the physical block does not satisfy a second threshold criterion pertaining to the age of the data; and
- responsive to the data stored on the physical block not satisfying the second threshold criterion, maintaining the counter to track the number of read operations performed on the plurality of blocks.

11. The system of claim 8, wherein the age of the data is based on an index number associated with the physical block, the index number representing how recently the data was written to the physical block relative to other physical blocks of the memory device.

12. The system of claim 8, wherein the processing device to perform operations further comprising:
- incrementing the value of the counter responsive to receiving a read request directed to the at least one of the physical block or the plurality of physical blocks of the memory device.

13. The system of claim 8, wherein determining whether the value of the counter satisfies the first threshold criterion comprises determining whether the value of the counter meets or exceeds a first read threshold.

14. The system of claim 8, wherein performing the data integrity scan comprises:
- determining whether the first error rate satisfies an error threshold criterion; and
- responsive to the first error rate satisfying the error threshold criterion:
  - relocating the data stored on the at least one of the physical block or the plurality of physical blocks to one or more others blocks of the memory device; and
  - resetting the value of the counter to an initial value.

15. A non-transitory computer-readable storage medium comprising instructions that, when executed by a processing device, cause the processing device to perform operations comprising:
- maintaining a counter to track a number of read operations performed on at least one of a physical block or a plurality of physical blocks of a memory device, wherein the counter is associated with the physical block or the plurality of physical blocks depending on an age of data stored on the physical block;
- determining whether a value of the counter satisfies a first threshold criterion pertaining to the number of read operations performed; and
- responsive to the value of the counter satisfying the first threshold criterion, performing a data integrity scan to determine a first error rate.

16. The non-transitory computer-readable storage medium of claim 15, wherein the instructions cause the processing device to perform operations further comprising:
- determining that the data stored on the physical block satisfies a second threshold criterion pertaining to the age of the data; and
- responsive to the data stored on the physical block satisfying the second threshold criterion, maintaining the counter to track the number of read operations performed on the physical block.

17. The non-transitory computer-readable storage medium of claim 15, wherein the instructions cause the processing device to perform operations further comprising:
- determining that the data stored on the physical block does not satisfy a second threshold criterion pertaining to the age of the data; and
- responsive to the data stored on the physical block not satisfying the second threshold criterion, maintaining the counter to track the number of read operations performed on the plurality of blocks.

18. The non-transitory computer-readable storage medium of claim 15, wherein the age of the data is based on an index number associated with the physical block, the index number representing how recently the data was written to the physical block relative to other physical blocks of the memory device.

19. The non-transitory computer-readable storage medium of claim 15, wherein the instructions cause the processing device to perform operations further comprising:
- incrementing the value of the counter responsive to receiving a read request directed to the at least one of the physical block or the plurality of physical blocks of the memory device.

20. The non-transitory computer-readable storage medium of claim 15, wherein performing the data integrity scan comprises:
- determining whether the first error rate satisfies an error threshold criterion; and
- responsive to the first error rate satisfying the error threshold criterion:
  - relocating the data stored on the at least one of the physical block or the plurality of physical blocks to one or more others blocks of the memory device; and
  - resetting the value of the counter to an initial value.

* * * * *

UNITED STATES PATENT AND TRADEMARK OFFICE
CERTIFICATE OF CORRECTION

| | |
|---|---|
| PATENT NO. | : 11,200,957 B2 |
| APPLICATION NO. | : 17/249087 |
| DATED | : December 14, 2021 |
| INVENTOR(S) | : Kishore Kumar Muchherla et al. |

It is certified that error appears in the above-identified patent and that said Letters Patent is hereby corrected as shown below:

On the Title Page

Item [63], delete "Continuation-in-part" and insert --Continuation--

Signed and Sealed this
Twenty-fourth Day of May, 2022

*Katherine Kelly Vidal*

Katherine Kelly Vidal
*Director of the United States Patent and Trademark Office*